(12) United States Patent  (10) Patent No.: US 8,098,739 B2
Kosuge                     (45) Date of Patent:     Jan. 17, 2012

(54) DECODING CIRCUIT

(75) Inventor: Tetsuo Kosuge, Gunma-ken (JP)

(73) Assignees: Sanyo Electric Co., Ltd., Osaka (JP);
Sanyo Semiconductor Co., Ltd.,
Gunma (JP)

( * ) Notice: Subject to any disclaimer, the term of this patent is extended or adjusted under 35 U.S.C. 154(b) by 1084 days.

(21) Appl. No.: 11/946,611

(22) Filed: Nov. 28, 2007

(65) Prior Publication Data
US 2008/0285658 A1    Nov. 20, 2008

(30) Foreign Application Priority Data

Nov. 30, 2006 (JP) .................................. 2006-322834

(51) Int. Cl.
*H04N 11/02* (2006.01)
(52) U.S. Cl. .................................................. 375/240.25
(58) Field of Classification Search ........................ None
See application file for complete search history.

(56) References Cited

U.S. PATENT DOCUMENTS 5,600,812 A * 2/1997 Park .............................. 711/200
5,933,536 A * 8/1999 Fukuzawa ..................... 382/246

FOREIGN PATENT DOCUMENTS

JP    2002-330076    11/2002

OTHER PUBLICATIONS esp@cenet patent abstract for Japanese Publication No. 2002330079, Publication date Nov. 15, 2002 (1 page).

* cited by examiner

*Primary Examiner* — Yong Zhou
(74) *Attorney, Agent, or Firm* — Osha Liang LLP

(57) ABSTRACT

Input bits having a predetermined number of bits are divided into a plurality of bits by a bit dividing apparatus. Several of the divided bits are input into a recording apparatus, and are converted into address information. The data subjected to variable length decoding and a number of bits of the data are output from the recording apparatus according to the output of the recording apparatus. A plurality of kinds of variable length decoding are performed by rewriting the table of the recording apparatus.

5 Claims, 7 Drawing Sheets

| Variable length code | dct_dc_size_luminance |
|---|---|
| 011 | 0 |
| 11 | 1 |
| 10 | 2 |
| 010 | 3 |
| 001 | 4 |
| 0001 | 5 |
| 00001 | 6 |
| 0000 01 | 7 |
| 0000 001 | 8 |
| 0000 0001 | 9 |
| 0000 0000 1 | 10 |
| 0000 0000 01 | 11 |
| 0000 0000 001 | 12 |

Fig. 3

| Variable length code | dct_dc_size_chrominance |
|---|---|
| 11 | 0 |
| 10 | 1 |
| 01 | 2 |
| 001 | 3 |
| 0001 | 4 |
| 0000 1 | 5 |
| 0000 01 | 6 |
| 0000 001 | 7 |
| 0000 0001 | 8 |
| 0000 00001 | 9 |
| 0000 0000 01 | 10 |
| 0000 0000 001 | 11 |
| 0000 0000 0001 | 12 |

Fig. 4

OUTPUT TABLE OF RECORDING APPARATUS B0

| bit11 | bit10 | bit9 | bit8 | | Match | Next Use | Address0 |
|---|---|---|---|---|---|---|---|
| 0 | 0 | 0 | 0 | | ○ | ○ | 0 |
| 0 | 0 | 0 | 1 | | ○ | × | 5 |
| 0 | 0 | 1 | 0 | | ○ | × | 4 |
| 0 | 0 | 1 | 1 | | ○ | × | 4 |
| 0 | 1 | 0 | 0 | | ○ | × | 3 |
| 0 | 1 | 0 | 1 | | ○ | × | 3 |
| 0 | 1 | 1 | 0 | | ○ | × | 0 |
| 0 | 1 | 1 | 1 | | ○ | × | 0 |
| 1 | 0 | 0 | 0 | | ○ | × | 2 |
| 1 | 0 | 0 | 1 | | ○ | × | 2 |
| 1 | 0 | 1 | 0 | | ○ | × | 2 |
| 1 | 0 | 1 | 1 | | ○ | × | 2 |
| 1 | 1 | 0 | 0 | | ○ | × | 1 |
| 1 | 1 | 0 | 1 | | ○ | × | 1 |
| 1 | 1 | 1 | 0 | | ○ | × | 1 |
| 1 | 1 | 1 | 1 | | ○ | × | 1 |

Fig. 5

OUTPUT TABLE OF RECORDING APPARATUS B1

| bit7 | bit6 | bit5 | bit4 | | Match | Next Use | Address1 |
|---|---|---|---|---|---|---|---|
| 0 | 0 | 0 | 0 | | ○ | ○ | 0 |
| 0 | 0 | 0 | 1 | | ○ | × | 9 |
| 0 | 0 | 1 | 0 | | ○ | × | 8 |
| 0 | 0 | 1 | 1 | | ○ | × | 8 |
| 0 | 1 | 0 | 0 | | ○ | × | 7 |
| 0 | 1 | 0 | 1 | | ○ | × | 7 |
| 0 | 1 | 1 | 0 | | ○ | × | 7 |
| 0 | 1 | 1 | 1 | | ○ | × | 7 |
| 1 | 0 | 0 | 0 | | ○ | × | 6 |
| 1 | 0 | 0 | 1 | | ○ | × | 6 |
| 1 | 0 | 1 | 0 | | ○ | × | 6 |
| 1 | 0 | 1 | 1 | | ○ | × | 6 |
| 1 | 1 | 0 | 0 | | ○ | × | 6 |
| 1 | 1 | 0 | 1 | | ○ | × | 6 |
| 1 | 1 | 1 | 0 | | ○ | × | 6 |
| 1 | 1 | 1 | 1 | | ○ | × | 6 |

Fig. 6

OUTPUT TABLE OF RECORDING APPARATUS B2

| bit3 | bit2 | bit1 | bit0 | Match | Address2 |
|---|---|---|---|---|---|
| 0 | 0 | 0 | 0 | × | 0 |
| 0 | 0 | 0 | 1 | × | 0 |
| 0 | 0 | 1 | 0 | ○ | 12 |
| 0 | 0 | 1 | 1 | ○ | 12 |
| 0 | 1 | 0 | 0 | ○ | 11 |
| 0 | 1 | 0 | 1 | ○ | 11 |
| 0 | 1 | 1 | 0 | ○ | 11 |
| 0 | 1 | 1 | 1 | ○ | 11 |
| 1 | 0 | 0 | 0 | ○ | 10 |
| 1 | 0 | 0 | 1 | ○ | 10 |
| 1 | 0 | 1 | 0 | ○ | 10 |
| 1 | 0 | 1 | 1 | ○ | 10 |
| 1 | 1 | 0 | 0 | ○ | 10 |
| 1 | 1 | 0 | 1 | ○ | 10 |
| 1 | 1 | 1 | 0 | ○ | 10 |
| 1 | 1 | 1 | 1 | ○ | 10 |

Fig. 7

RECORDING APPARATUS D

| ADDRESS | dct_dc_size_luminance | bit length |
|---|---|---|
| 0 | 0 | 3 |
| 1 | 1 | 2 |
| 2 | 2 | 2 |
| 3 | 3 | 3 |
| 4 | 4 | 3 |
| 5 | 5 | 4 |
| 6 | 6 | 5 |
| 7 | 7 | 6 |
| 8 | 8 | 7 |
| 9 | 9 | 8 |
| 10 | 10 | 9 |
| 11 | 11 | 10 |
| 12 | 12 | 11 |

Fig. 8

OUTPUT TABLE OF RECORDING APPARATUS B0

| bit11 | bit10 | bit9 | bit8 | | Match | Next Use | Address |
|---|---|---|---|---|---|---|---|
| 0 | 0 | 0 | 0 | | ○ | ○ | 0 |
| 0 | 0 | 0 | 1 | | ○ | × | 4 |
| 0 | 0 | 1 | 0 | | ○ | × | 3 |
| 0 | 0 | 1 | 1 | | ○ | × | 3 |
| 0 | 1 | 0 | 0 | | ○ | × | 2 |
| 0 | 1 | 0 | 1 | | ○ | × | 2 |
| 0 | 1 | 1 | 0 | | ○ | × | 2 |
| 0 | 1 | 1 | 1 | | ○ | × | 2 |
| 1 | 0 | 0 | 0 | | ○ | × | 1 |
| 1 | 0 | 0 | 1 | | ○ | × | 1 |
| 1 | 0 | 1 | 0 | | ○ | × | 1 |
| 1 | 0 | 1 | 1 | | ○ | × | 1 |
| 1 | 1 | 0 | 0 | | ○ | × | 0 |
| 1 | 1 | 0 | 1 | | ○ | × | 0 |
| 1 | 1 | 1 | 0 | | ○ | × | 0 |
| 1 | 1 | 1 | 1 | | ○ | × | 0 |

Fig. 9

OUTPUT TABLE OF RECORDING APPARATUS B1

| bit7 | bit6 | bit5 | bit4 | | Match | Next Use | Address |
|---|---|---|---|---|---|---|---|
| 0 | 0 | 0 | 0 | | ○ | ○ | 0 |
| 0 | 0 | 0 | 1 | | ○ | × | 8 |
| 0 | 0 | 1 | 0 | | ○ | × | 7 |
| 0 | 0 | 1 | 1 | | ○ | × | 7 |
| 0 | 1 | 0 | 0 | | ○ | × | 6 |
| 0 | 1 | 0 | 1 | | ○ | × | 6 |
| 0 | 1 | 1 | 0 | | ○ | × | 6 |
| 0 | 1 | 1 | 1 | | ○ | × | 6 |
| 1 | 0 | 0 | 0 | | ○ | × | 5 |
| 1 | 0 | 0 | 1 | | ○ | × | 5 |
| 1 | 0 | 1 | 0 | | ○ | × | 5 |
| 1 | 0 | 1 | 1 | | ○ | × | 5 |
| 1 | 1 | 0 | 0 | | ○ | × | 5 |
| 1 | 1 | 0 | 1 | | ○ | × | 5 |
| 1 | 1 | 1 | 0 | | ○ | × | 5 |
| 1 | 1 | 1 | 1 | | ○ | × | 5 |

Fig. 10

OUTPUT TABLE OF RECORDING APPARATUS B2

| bit3 | bit2 | bit1 | bit0 | Match | Address |
|---|---|---|---|---|---|
| 0 | 0 | 0 | 0 | × | 0 |
| 0 | 0 | 0 | 1 | ○ | 12 |
| 0 | 0 | 1 | 0 | ○ | 11 |
| 0 | 0 | 1 | 1 | ○ | 11 |
| 0 | 1 | 0 | 0 | ○ | 10 |
| 0 | 1 | 0 | 1 | ○ | 10 |
| 0 | 1 | 1 | 0 | ○ | 10 |
| 0 | 1 | 1 | 1 | ○ | 10 |
| 1 | 0 | 0 | 0 | ○ | 9 |
| 1 | 0 | 0 | 1 | ○ | 9 |
| 1 | 0 | 1 | 0 | ○ | 9 |
| 1 | 0 | 1 | 1 | ○ | 9 |
| 1 | 1 | 0 | 0 | ○ | 9 |
| 1 | 1 | 0 | 1 | ○ | 9 |
| 1 | 1 | 1 | 0 | ○ | 9 |
| 1 | 1 | 1 | 1 | ○ | 9 |

Fig. 11

RECORDING APPARATUS D

| ADDRESS | dct_dc_size_luminance | bit lengh |
|---|---|---|
| 0 | 0 | 2 |
| 1 | 1 | 2 |
| 2 | 2 | 2 |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| 10 | 10 | 10 |
| 11 | 11 | 11 |
| 12 | 12 | 12 |

Fig. 12

DECODING CIRCUIT

CROSS-REFERENCE TO RELATED APPLICATIONS

This application claims priority to Japanese Patent Application No. 2006-322834, filed on Nov. 30, 2006.

BACKGROUND OF THE INVENTION

1. Field of the Invention

The present invention relates to a decoding circuit decoding a data stream coded by the variable length coding.

2. Description of the Related Art

Many compression systems of an image and a sound adopt a system of performing the variable length coding of a signal processed using discrete cosine transform (DCT), and a representative one of such coding is Huffman coding. When a signal coded by Huffman coding is transmitted, the receiving side performs Huffman decoding of the transmitted signal by software or hardware. Because it takes a long processing time when the image size is large, the Huffman decoding is frequently realized by hardware.

There are currently a plurality of compression systems, and the number of the receivers, each supporting a plurality of compression systems, has increased. For example, a decoder of a next generation digital versatile disc (DVD), such as a HD-DVD and a Blue-ray Disc (registered trademark), must be able to expand all the compressed signals by MPEG-2, H.264, and VC-1. Incidentally, Huffman decoding is described in Japanese Patent Laid-Open Publication No. 2002-330076 and the like.

However, coding systems such as MPEG-2, MPEG-4 part 2, H. 264, and VC-1 severally assign a code peculiar to each coding form to the Huffman code used in the system. If a plurality of Huffman decoders are mounted in a receiver, the receiver must have decoding tables dealing with the respective coding systems because the respective coding systems have different coding tables. Consequently, the receiver has a problem of increasing the circuit size thereof.

SUMMARY OF THE INVENTION

The present invention makes it possible to deal with a plurality of kinds of variable length coding with one piece of hardware.

BRIEF DESCRIPTION OF THE DRAWINGS

FIG. 3 is a diagram showing an example of a variable length code;

FIG. 4 is a diagram showing another example of the variable length code;

FIG. 5 is a diagram showing the table contents of a recording apparatus B0 in the case of the variable length code of FIG. 3;

FIG. 6 is a diagram showing the table contents of a recording apparatus B1 in the case of the variable length code of FIG. 3;

FIG. 7 is a diagram showing the table contents of a recording apparatus B2 in the case of the variable length code of FIG. 3;

FIG. 8 is a diagram showing the table contents of a recording apparatus D in the case of the variable length code of FIG. 3;

FIG. 9 is a diagram showing the table contents of a recording apparatus B0 in the case of the variable length code of FIG. 4;

FIG. 10 is a diagram showing the table contents of a recording apparatus B1 in the case of the variable length code of FIG. 4;

FIG. 11 is a diagram showing the table contents of a recording apparatus B2 in the case of the variable length code of FIG. 4; and FIG. 12 is a diagram showing the table contents of a recording apparatus D in the case of the variable length code of FIG. 4.

DESCRIPTION OF PREFERRED EMBODIMENTS

In the following, the preferred embodiment of the present invention will be described with reference to the attached drawings.

Figure 1:
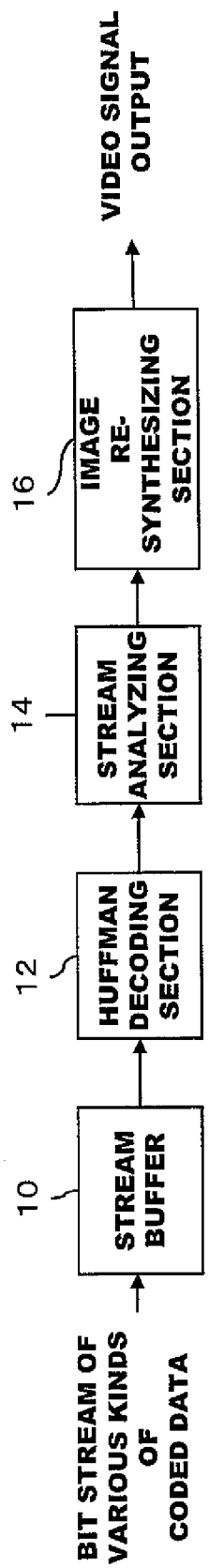
FIG. 1 is a diagram showing the overall configuration of a decoding apparatus.

FIG. 1 is a diagram showing the outline of the whole configuration of a decoding apparatus. A bit stream of coded data is first stored in a stream buffer 10 temporarily, and is supplied to a Huffman decoding section 12 from here. The data decoded by the Huffman decoding section 12 in accordance with the Huffman decoding is processed by a stream analyzing section 14 in accordance with the decoding processing according to the coding system of the data, and is subjected to processing such as intra-frame prediction, inter-frame prediction, and motion compensation by an image re-synthesizing section 16. The processed data is thus demodulated to a digital video signal to be output.

Figure 2:
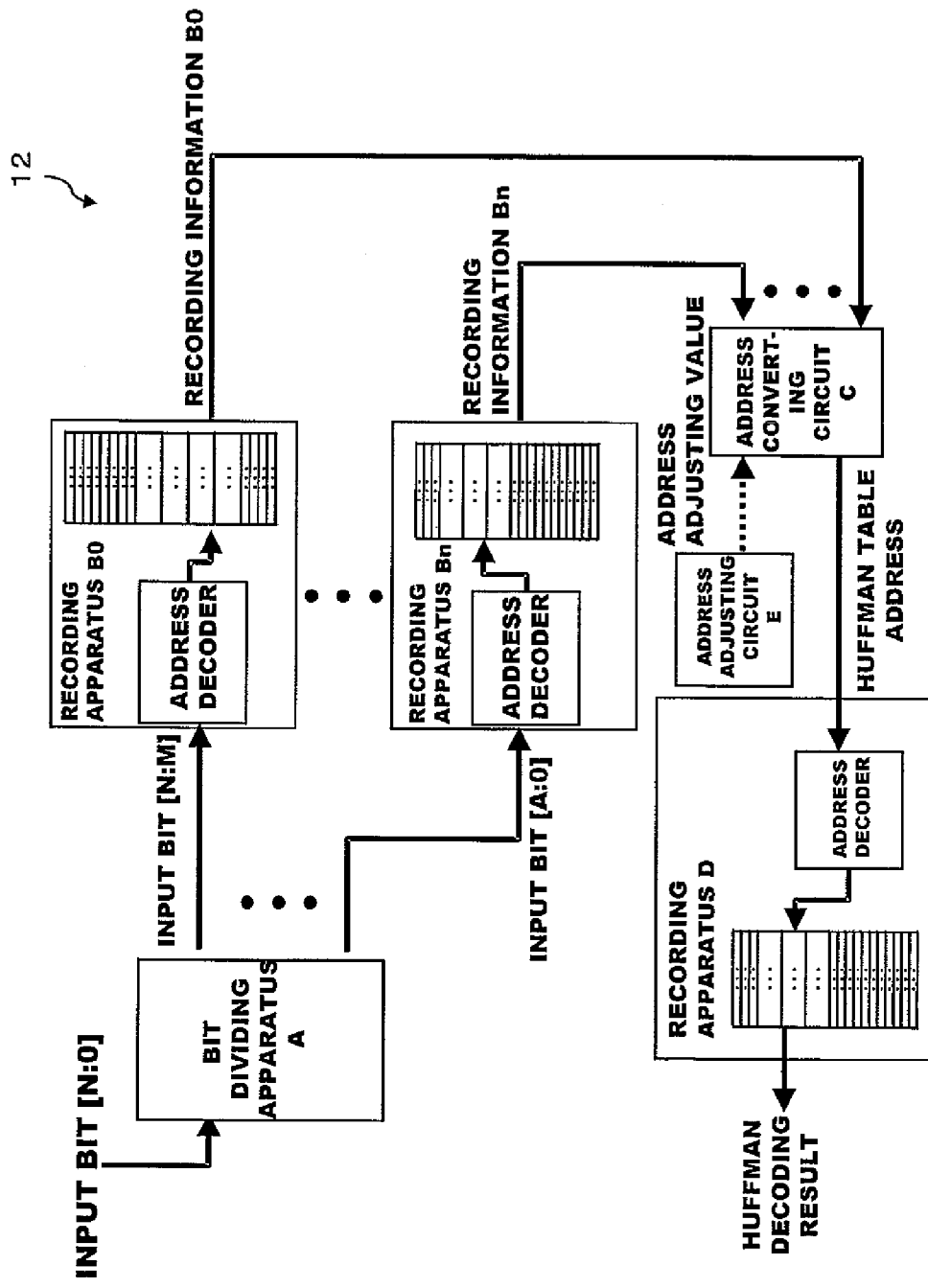
FIG. 2 is a diagram showing a configuration for variable length decoding.

FIG. 2 is a diagram showing a configuration example of the Huffman decoding section 12. The input bits of N+1 bits [N:0] are supplied to a bit dividing apparatus A. The bit dividing apparatus A divides (separates) a piece of data coded by the Huffman coding into n pieces. Then, the bit dividing apparatus supplies the divided n pieces of data to recording apparatus B0-Bn, respectively.

In this example, the input bits [N:M] from the most significant bit N to an Mth bit are supplied to the recording apparatus B0, and the input bits [A:0] from an Ath bit to the least significant bit 0 are supplied to a recording apparatus Bn. Incidentally, it is preferable that the number of the input bits to be input into the bit dividing apparatus A is equal to or more than the maximum bit number of the data when the data is coded by the Huffman coding, for example, it is preferable to set the number to the maximum bit number. Thereby, it becomes possible to perform decoding while dealing with all coding methods reliably.

The recording apparatus B includes an address decoder and a table therein, and decodes the supplied separated input bits to determine their addresses. The recording apparatus B outputs the data at the determined addresses in the table (recorded information B0, . . . , and Bn).

For example, if the number of input bits to the recording apparatus B is 4, then there are 16 combinations of bits. The recording apparatus B0-Bn outputs the pieces of recorded information B0, . . . , and Bn corresponding to the input bits. The pieces of recorded information B0, . . . , and Bn can be uniquely determined by a coding method. If the coding method is changed, the table is rewritten.

The pieces of recorded information B0, . . . , and Bn are supplied to an address converting circuit C. The address converting circuit C adds the pieces of recorded information B0, ..., and Bn together to obtain a Huffman table address.

The obtained Huffman table address is supplied to a recording apparatus D. Also the recording apparatus D includes an address decoder and a table therein, and outputs the decode data written at the address of the supplied Huffman table address and the bit length of the decode data. Incidentally, luminance data coded by the discrete cosine coding (dct_dc_size_luminance) can be considered as an example of the decode data.

Next, concrete examples are described. For example, in the variable length coding adopted by a certain standard, variable length codes (the maximum number of bits: 11) are assigned to the discrete cosine coded luminance DC data (dct_dc_size_luminance) 0-12 as shown in FIG. 3. Moreover, in the variable length coding adopted by another standard, variable length codes (the maximum number of bits: 12) are assigned to the discrete cosine coding luminance data as shown in FIG. 4.

When the case of dealing with the two variable length codes is examined, the number of input bits of the bit dividing apparatus A is set to be 12 bits in order to deal with both the variable length codes. The bit dividing apparatus A then divides the 12 bits into 3 groups of 4 bits. Bits 11-8 are supplied to the recording apparatus B0; bits 7-4 are supplied to the recording apparatus B1; and bits 3-0 are supplied to the recording apparatus B2. The recording apparatus B0, B1, and B2 output whether there is any coincident code to the inputs of 4 bits or not (Match), whether there are any coincident codes to the lower-order bits (Next Use), and the address data (Address 0) in the recording apparatus D.

The case of using the variable length code shown in FIG. 3 is described. In this case, the table of the recording apparatus B0 stores the data shown in FIG. 5. In this manner, the recording apparatus B0 outputs that there are coincidences to all the inputs (Match=1), that there is coincidence of the lower-order bits only to 0000 (Next Use=1), and data 0-5 as the address data of the recording apparatus D to the other inputs.

That is, in FIG. 3 the pieces of luminance data 0-5 are the data of 4 bits or less, and for these values, the recording apparatus B0 outputs the luminance data corresponding to the inputs coinciding with the values of the variable length codes of FIG. 3 when the inputs are aligned to the left as the addresses.

Moreover, the data shown in FIG. 6 is stored in the table of the recording apparatus B1. In this manner, the recording apparatus B0 outputs that there are coincidences to all the inputs (Match=1), that there is coincidence of the lower-order bits only to 0000 (Next Use=1), and data 6-9 as the address data of the recording apparatus D to the other inputs.

That is, in FIG. 3, the pieces of luminance data 6-9 are the data of 5-8 bits, and for these values, the recording apparatus B1 outputs the luminance data corresponding to the inputs coinciding with the 5-8 bits of the variable length codes of FIG. 3 when the inputs are aligned to the left as the addresses.

The table of the recording apparatus B2 stores the data shown in FIG. 7. In this manner, the recording apparatus B2 includes the bits up to the least significant bit, and no bits less than the least significant bit. Then, as for the Next Use, no data is originally necessary. Moreover, there are no coincident code with the inputs of 0000, 0001 (Match=0), and there are coincident code to the other inputs (Match=1). The recording apparatus B0 outputs data 10-12 to the other inputs as the address data of the recording apparatus D.

That is, in FIG. 3, the pieces of luminance data 10-12 are the date of 9-11 bits. For these values, in the recording apparatus B1, the luminance data corresponding to the inputs coinciding with bits 9-11 of the variable length codes in FIG. 3 when the inputs are aligned to the left is output as the address.

Then, the address converting circuit C adopts necessary outputs from the values of the Next Use=0 and Match=1 in the outputs of the recording apparatus B0-B2, and determines all Match=1. In the case of all Match=1, the value of the address is added, and the address to be input into the recording apparatus D is determined.

Then, the address converting circuit C inputs the determined address into the recording apparatus D, and outputs the corresponding discrete cosine transform luminance data as shown in FIG. 8. In this example, the address and the discrete cosine transform luminance data to be output are the same. Moreover, in FIG. 3, the bit length of respective discrete cosine transform luminance data is determined, and an output also includes the bit length.

Then, the input to the bit dividing apparatus A is shifted by the obtained bit length. That is, only the bits that have been actual data in the former input are abandoned from the higher-order bits, and the data of 12 bits lower than the abandoned bits are input into the bit dividing apparatus A as new input bits.

In the case of using the variable length code shown in FIG. 4, the recording apparatus B0-B2 are provided with the tables of FIGS. 9-11. In the case of FIG. 4, because the maximum bit length of the variable length code are 12 bits, Match=0 only when all of the 12 bits are 0. Then, as for the discrete cosine transform luminance data 0-4, the addresses are determined only on the basis of the output of the recording apparatus B0. As for the discrete cosine transform luminance data 5-8, the addresses are determined on the basis of the outputs of the recording apparatus B0 and B1. As for the discrete cosine transform luminance data 9-12, the addresses are determined on the basis of the outputs of the recording apparatus B0, B1, and B2.

As described above, according to the present embodiment, the recording apparatus B stores the matching information and the like corresponding to the input bit trains (the information to be used of the output determination of the address converting circuit C). The input bits may be directly connected to the recording apparatus B. However, because it is normal to assign the short Huffman codes in order from one having a higher frequency of appearance, the capacity of the recording apparatus B becomes redundant in the case of this type of configuration. Accordingly, it becomes possible to optimize the capacity of the recording apparatus B by breaking down the input bits into a proper bit width by the bit dividing apparatus A. Next, the address converting circuit C calculates the addresses of the Huffman decoding table (recording apparatus D) by the use of the output results of the recording apparatus B. Then, the recording apparatus D outputs the data corresponding to the addresses, and the Huffman decode is completed.

By adopting the circuit configuration like the above, it becomes possible to decode a plurality of Huffman codes by rewriting the tables of the recording apparatus B0, B1, ..., and Bn and the recording apparatus D by downloading the data from the outside (for example, SDRAM).

[The Other]

If a rewritable address adjusting apparatus E is added to the address converting circuit C, it is sufficient to rewrite only the address adjusting apparatus E in the case where a result changes in accordance with a parameter even if the codes are the same. Consequently, the addition of the address adjusting apparatus E can shorten the rewriting time. That is, the table of the recording apparatus B is not rewritten, but the address converting circuit C changes the Address to be output. For example, a table containing the correspondence relations of the addresses determined on the basis of the outputs of the recording apparatus B and the addresses to be input into the recording apparatus D is prepared in the address adjusting apparatus E, and then the only thing required is to rewrite only the table in the address adjusting apparatus E in the case where no change occurs in the variable length code to be used.

In the case where the maximum bit length of the variable length code is smaller than the number of bits to be input into the bit dividing apparatus A, it is necessary to copy the same values as those of the unnecessary bits to input the same values into the table of the object. At the stage of the completion of the determination of the kind of the variable length code and the determination of the maximum bit length, the range of the bits to be used in the recording apparatus B may be specified to prohibit input and output outside of the necessary range. Thereby, the rewriting of the table of the unnecessary bits becomes unnecessary, and the processing can also be simplified.

What is claimed is:

1. A decoding circuit decoding a data stream subjected to variable length coding, comprising:
    a dividing circuit dividing data of a predetermined number of bits in the data stream into a plurality of pieces of data from higher-order bits;
    a plurality of first step comparison circuits receiving the respective divided pieces of data supplied by said dividing circuit and outputting values corresponding to the respective divided pieces of data by referring to a table;
    a second step comparison circuit outputting decoded data and a number of bits in the data stream corresponding to the decoded data by referring to a variable length coding table based on a table address resulted from the output of the plurality of first step comparison circuits; and
    a shift circuit shifting the data stream to be divided by said dividing circuit according to the number of bits obtained by the second step comparison circuit,
    wherein the second step comparison circuit outputs the decoded data,
    wherein, when the dividing circuit divides data of the predetermined number of bits in the data stream into a plurality of pieces of data, each piece of data includes a plurality of bits,
    wherein each one of the plurality of bits in the data stream is assigned to a corresponding piece of the plurality of pieces, and
    wherein each bit in the data stream is assigned to only the one corresponding piece of the plurality of pieces.

2. The decoding circuit according to claim 1, wherein the tables to be used in said first step comparison circuit and said second step comparison circuit are rewritable.

3. The decoding circuit according to claim 1, wherein said first step comparison circuit and said second step comparison circuit obtain addresses by decoding input data, and output data written at addresses corresponding to the tables.

4. The decoding circuit according to claim 1, wherein said plurality of first step comparison circuits output several addresses, and said second step comparison circuit determines the table addresses based on a result of addition of the addresses of said first step comparison circuits to output the decode data and the number of bits from the determined addresses.

5. The decoding circuit according to claim 1, wherein the variable length coding is Huffman coding.

* * * * *